United States Patent
Vishal et al.

(10) Patent No.: US 9,514,970 B2
(45) Date of Patent: Dec. 6, 2016

(54) METHODS OF ATTACHING A MODULE ON WAFER SUBSTRATE

(71) Applicants: Vaibhaw Vishal, Fremont, CA (US); Andrew Nguyen, San Jose, CA (US); Kristopher K. Hearn, San Jose, CA (US); Mei Sun, Los Altos, CA (US)

(72) Inventors: Vaibhaw Vishal, Fremont, CA (US); Andrew Nguyen, San Jose, CA (US); Kristopher K. Hearn, San Jose, CA (US); Mei Sun, Los Altos, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 456 days.

(21) Appl. No.: 13/797,112

(22) Filed: Mar. 12, 2013

(65) Prior Publication Data
US 2014/0202267 A1 Jul. 24, 2014

Related U.S. Application Data

(60) Provisional application No. 61/756,225, filed on Jan. 24, 2013.

(51) Int. Cl.
*G01K 1/12* (2006.01)
*H01L 21/67* (2006.01)

(52) U.S. Cl.
CPC .......... *H01L 21/67248* (2013.01); *Y10T 29/53* (2015.01)

(58) Field of Classification Search
None
See application file for complete search history.

(56) References Cited

U.S. PATENT DOCUMENTS 1,915,835 A * 6/1933 Pajeau ........................ 446/103
4,990,720 A 2/1991 Kaufman
(Continued)

FOREIGN PATENT DOCUMENTS

JP 2003161316 A 6/2003
JP 2004006199 A 1/2004

OTHER PUBLICATIONS

International Search Report and Written Opinion for International Application No. PCT/US2014/012910, dated May 20, 2014.
(Continued)

*Primary Examiner* — Robert R Raevis
(74) *Attorney, Agent, or Firm* — Joshua D. Isenberg; JDI Patent

(57) ABSTRACT

Aspects of the present disclosure describe an attachment device for mounting a module to a substrate comprises a module leg with two ends and a module foot. One end of the module leg is configured to be attached to a bottom surface of the module and the other end of the module leg is configured to be attached to the module foot. At least a portion of the module foot is configured to be attached to the substrate. Also a portion of a surface area of the module foot is configured to be exposed outside of an area covered by the module. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

26 Claims, 5 Drawing Sheets

(56) References Cited

U.S. PATENT DOCUMENTS

| | | |
|---|---|---|
| 7,757,574 B2 | 7/2010 | Renken et al. |
| 8,604,361 B2 | 12/2013 | Sun et al. |
| 8,681,493 B2 | 3/2014 | Vishal et al. |
| 2007/0226995 A1* | 10/2007 | Bone .................. H01L 23/4824 29/832 |
| 2009/0305527 A1 | 12/2009 | Wertz et al. |
| 2010/0294051 A1 | 11/2010 | Renken et al. |
| 2011/0076869 A1* | 3/2011 | Braem ............... H01R 13/2407 439/188 |
| 2012/0074514 A1 | 3/2012 | Nguyen et al. |
| 2012/0309260 A1* | 12/2012 | Coon ........................... 446/124 |

OTHER PUBLICATIONS

U.S. Appl. No. 61/756,225, to Vaibhaw Vishal et al., filed Jan. 24, 2013.
U.S. Appl. No. 61/274,116, to Mei Sun et al., filed Dec. 18, 2009.

\* cited by examiner

METHODS OF ATTACHING A MODULE ON WAFER SUBSTRATE

This application claims the priority benefit of commonly owned, U.S. Provisional Patent Application No. 61/756,225, to Vaibhaw Vishal et al, filed Jan. 24, 2013, and entitled "METHODS OF ATTACHING A MODULE ON WAFER SUBSTRATE" the entire disclosures of which are incorporated herein by reference.

FIELD OF THE INVENTION

Embodiments of the present invention relate to high temperature process condition measuring devices, and more particularly, to an apparatus and a method for attaching a heat shield module on the wafer substrate of a process condition measuring device.

BACKGROUND OF THE INVENTION

Semiconductor fabrication generally involves numerous sophisticated and complex processing steps. Monitoring and evaluation of each process step is crucial to ensure the manufacturing accuracy and to ultimately achieve the desired performance of a finished device. Throughout numerous processes, such as the imaging process, deposition and growth process, etching and masking process, it is critical, for example, that temperature, gas flow, vacuum pressure, chemical gas or plasma composition and exposure distance be carefully controlled during each step. Careful attention to the various processing conditions involved in each step is a requirement of optimal semiconductor or thin film processes. Any deviation from optimal processing conditions may cause the ensuing integrated circuit or device to perform at a substandard level or, worse yet, fail completely. Processing conditions include parameters used to control semiconductor or other device manufacture or conditions a manufacturer would desire to monitor.

Within a processing chamber, processing conditions can vary. The variations in processing conditions such as temperature, gas flow rate and/or gas composition greatly affect the formation and thus the performance of the integrated circuit. Using a substrate-like device to measure the processing conditions that is of the same or similar material as the integrated circuit or other device provides the most accurate measure of the conditions because the thermal conductivity of the substrate is the same as the actual circuits that will be processed. Gradients and variations exist throughout the chamber for virtually all process conditions. These gradients therefore also exist across the surface of a substrate. In order to precisely control processing conditions at the substrate, it is critical that measurements be taken upon the substrate and that the readings are available to an automated control system or operator so that the optimization of the chamber processing conditions can be readily achieved.

In recent years, low profile wireless measuring devices have been developed. They are typically mounted on the substrate to measure the processing conditions. For a low profile wireless measuring device to work in a high temperature environment (e.g., temperatures greater than about 150° C.), certain key components of the device, such as thin batteries and microprocessors, must be able to function when the device is exposed to the high temperature environment. In general, the back AR coating (BARC) process operates at 250° C.; a CVD process may operate at a temperature of about 500° C.; and a PVD process may operate at about 300° C. Unfortunately, batteries and microprocessors suitable for being used with the measuring devices cannot withstand temperature above 150° C. While wired measuring device may measure temperatures higher than 150° C., they are not preferred because they are cumbersome and require a long downtime associated with a measurement.

In order to make wireless measuring devices work at temperatures higher than 150° C., low profile heat shield modules have been proposed for protection of temperature sensitive components (i.e., CPU, battery) of the measuring device. These modules are typically attached to the wafer substrate. Some methods have been proposed in associated with attachment of the module to the wafer substrate.

One example of conventional mounting of a heat shield module is shown in FIG. 5. The module (not shown) may be conventionally attached to a substrate 101 by inserting one or more rivet shaped pins 102 in a respective recessed cavity 103, called a T-slot, in the substrate. In particular, a rivet-shaped pin 102 is inserted in a T-slot, and the remainder of the cavity 103 is filled with a suitable adhesive such as epoxy or polyimide. With this method, the wafer has to be grinded, and introduction of micro-cracks during a grinding process would weaken the wafer. Also, sliding the rivet pin into the T-slot may cause the lip of the T-slot to fracture. Additionally, the T-slot may break if the height of the rivet pin head is slightly taller than the T-slot height or if all of the rivet pins do not fall on exactly the same plane.

It is within this context that embodiments of the present invention arise.

SUMMARY OF THE INVENTION

According to aspects of the present disclosure, an attachment device for mounting a module to a substrate comprises a module leg with two ends and a module foot. One end of the module leg is configured to be attached to a bottom surface of the module and another end of the module leg is configured to be attached to the module foot. At least a portion of the module foot is configured to be attached to the substrate. Also a portion of a surface area of the module foot is configured to be exposed outside of an area covered by the module when the module is mounted to the substrate.

According to additional aspects of the present disclosure, a process condition measuring device comprises a substrate with measurement electronics and interconnect wiring formed on the substrate, one or more module and one or more attachment devices for mounting the modules on the wafer substrate. Each of the modules includes a temperature sensitive component. Each of the attachment devices comprises a module leg with two ends and a module foot. One end of the module leg is attached to a bottom surface of the module and the other end of the module leg is attached to the module foot. At least a portion of the module foot is attached to the wafer substrate. Also a large surface area of the module foot is exposed outside of an area covered by the module.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Figure 1A:
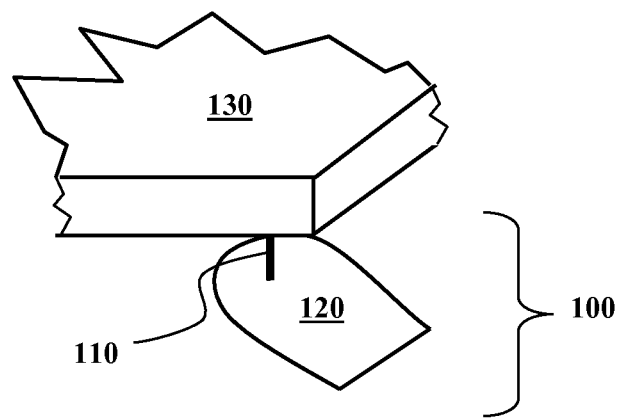
FIG. 1A illustrates an attachment device for mounting a module on a wafer substrate according to an aspect of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. Additionally, because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims. "Optional" or "optionally" means that the subsequent described circumstance may or may not occur, so that the description includes instances where the circumstance occurs and instances where it does not. For example, if a device optionally contains a feature A, this means that the feature A may or may not be present, and thus, the description includes both structures wherein a device possesses the feature A and structures wherein the feature A is not present.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. that are within the recited limits.

According to aspects of the present disclosure, a process condition measuring device may include a wafer substrate and one or more heat shield modules attaching to the substrate. The wafer substrate may be the same size and shape as a standard substrate processed by a substrate processing system. The substrate may be made of the same material as a standard substrate processed by the system. For example, if the measuring device is used to monitor process conditions in a semiconductor wafer processing system that processes silicon wafers, the substrate may be made of silicon. Examples of standard sized silicon substrate include, but are not limited to 150-mm, 200-mm, 300-mm, and 450 mm. Measurement electronics and interconnect wiring may be formed on the substrate surface. By way of example, and not by way of limitation, the measurement electronics may include a memory, a transceiver and one or more process condition sensors, e.g., an electromagnetic sensor, a thermal sensor and an optical or electrical sensor. Details of various types of sensors can be found in commonly assigned, co-pending U.S. patent application Ser. No. 12/892,841 filed Sep. 28, 2010 and fully incorporated herein by reference for all purposes. These measurement electronics are powered by a battery and are configured to exchange electronic signals with a CPU through the interconnect wiring (e.g., buses). The CPU may be configured to execute instructions stored in the main memory in order for the measuring device to properly measure and record process parameters when the device is placed within a substrate processing tool. Certain temperature sensitive elements of the measurement electronics may be included within a heat shield module. By way of example, and not by way of limitation, a battery and a CPU may each be enclosed in a module.

One or more heat shield modules are provided for protecting/shielding components of the measuring device from a high temperature environment. In one example, a heat shield module includes a temperature sensitive component, such as battery or CPU, which is encapsulated on both sides by insulating layers. The combination of the component and the insulating layers may be further enclosed or surrounded by a high specific heat enclosure. Other examples of a heat shield module can be found in commonly assigned, co-pending U.S. patent application Ser. No. 13/104,874 filed May 10, 2011 and U.S. Provisional Application No. 61/274, 116 filed Dec. 18, 2009 and fully incorporated herein by reference for all purposes. The heat shield module is in turn bonded to the substrate or attached to the substrate by way of legs or supports. It should be understood that the "heat shield module" referred in this specification when describing embodiment of the present disclosure, is not limited to any particular module as long as it is a device for protection of a temperature sensitive component to be mounted on a wafer substrate.

The present disclosure describes an apparatus and a method of attaching a heat shield module on the substrate of a process condition measuring device. A primary requirement for an attachment of the heat shield module to the wafer substrate is to not increase heat flow to the module from the substrate. The attachment device also needs to be reasonably strong so that shipping vibration or handling (either manually or by robot) in the process chamber would not break off the module. As used herein, an "apparatus" refers to "elements that are assembled or not".

FIG. 1A shows an attachment device for mounting a heat shield module on a wafer substrate in accordance with an aspect of the present disclosure. The attachment device 100 includes a module leg 110 and a module foot 120.

Figure 1B:
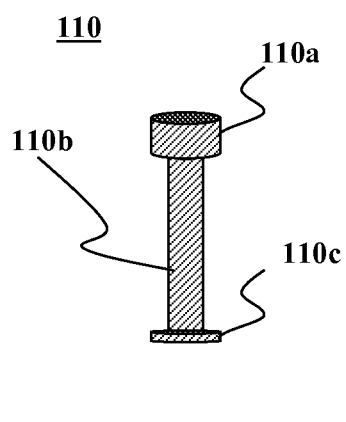
FIG. 1B is a module leg of an attachment device according to an aspect of the present disclosure.

The module leg 110 is attached to the bottom surface of the heat shield module at one end and to the top surface of a module foot 120 at the other end. The module leg 110 may be configured to provide a very limited conductive heat transfer path from the wafer substrate and/or the foot 120 to the heat shield module 130. FIG. 1B shows one example of a module leg in accordance with the present disclosure. Specifically, the module leg 110 includes three portions, a top portion 110a, a body portion 110b and a bottom portion 110c. By way of example, and not by way of limitation, the diameter/width of the top portion 110a and the bottom portion 110c of the leg 110 may range from about 1.0 mm to 4.0 mm, and the diameter/width of the body portion 110b may range from about 0.25 mm to 1.0 mm. The top portion 110a may range from about 1 mm to about 5 mm in thickness and the thickness of the bottom portion 110c may range from about 0.1 mm to 0.4 mm.

Additionally, the heat transfer efficiency may also be limited by making the leg 110 from a high-strength low thermal conductivity and/or high heat capacity material. By way of example, and not by way of limitation, the leg 110 may be composed of stainless steel (e.g., 316 Stainless), quartz, Kovar®, Invar®, Alloy 42, Macor®, sapphire or any other materials that are strong enough to hold the heat shield module 130 above the substrate and exhibit low heat transfer characteristics. Kovar® is a trademark of Carpenter Technology Corporation of reading, Pa. Kovar® refers to a nickel-cobalt ferrous alloy designed to be compatible with the thermal expansion characteristics of borosilicate glass. The composition of Kovar is about 29% nickel, 7% cobalt, less than 0.01% carbon, 0.2% silicon, 0.3% manganese with the balance being iron. Invar® is a trademark of Imphy Alloys Joint Stock Company France of Hauts-De-Seine, France. Invar®, also known generically as FeNi36 (64FeNi in the U.S.), is a nickel steel alloy notable for its uniquely low coefficient of thermal expansion. Alloy 42 is a nickel iron alloy whose coefficient of expansion makes it suitable for joining to ceramic chips in miniature electronic circuits. Macor® refers to a commercially available machinable glass-ceramic. Macor® is a registered trademark of Corning Glass Works Corporation of Corning, N.Y. The leg 110 functions as a mechanical support for the heat shield module. Optionally, the leg 110 may be used to provide an electrical grounding path for the heat shield module 130.

Referring back to FIG. 1A, the module foot 120 may be a thin piece of material. It may be made of a material that has a CTE (coefficient of thermal expansion) similar to that of the substrate, such as Kovar®. Kovar® has a CTE that closely matches CTE of the substrate. The foot 120 may also be made of silicon, sapphire, Kovar®, Invar®, Alloy 42, stainless steel or any other material that exhibits a CTE similar to that of the substrate material, which may be silicon. By way of example, and not by way of limitation, the foot 120 may be circular, rectangular, or like duck feet in shape. The area of the foot 120 is relatively large and may be, for example, about 10 mm×10 mm in size having a semicircle with a diameter of 10 mm on the end where the leg 110 is attached. It should be understood that the shape and size of the module leg 110 and the module foot 120 can be changed to increase or decrease surface area of contact.

Figure 1C:
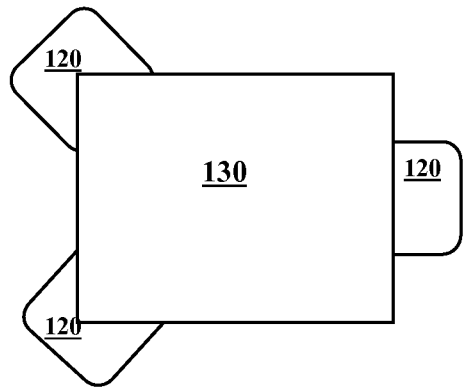
FIG. 1C illustrates a heat shield module with attachment devices according to an aspect of the present disclosure.

For each heat shield module 130, one or more attachment devices 100 may be provided for mounting the module on the substrate of the measuring device. FIG. 1C shows an example with three attachment devices 100 provided. The heat shield module 130 may be about 35 mm×35 mm in size with a mass of about 40 grams. For each attachment device 100, the leg 110 is attached to the bottom of the heat shield module 130 at one end either by press fitting, gluing, or welding. The other end of the module leg 110 is attached to a module feet 120 by press fitting or welding. The feet 120 are attached to the wafer substrate with any suitable high temperature adhesive such as epoxy, polyimide, or ceramic adhesive, etc. Since the module feet 120 have a large surface area, it can adhere well with the silicon substrate. Moreover, as shown in FIG. 1C, a portion of a surface area of each module foot 120 is outside the footprint of the module 130, which may avoid increasing heat transfer due to conduction and convection if the feet 120 were inside the module footprint. It is noted that in some (but not necessarily all) of the surface area of each module foot 120 lies outside the footprint of the module 130. However, some of the surface area of each module foot may lie within the module footprint.

An example to assemble the attachment devices 100 on a wafer substrate includes the following steps. First, one or more module legs 110 are attached to the respective module feet 120 at one end. The other end of the module legs 110 are then welded to the bottom surface of the module 130. Finally, the feet 120 are attached to the wafer substrate.

Figure 2A:
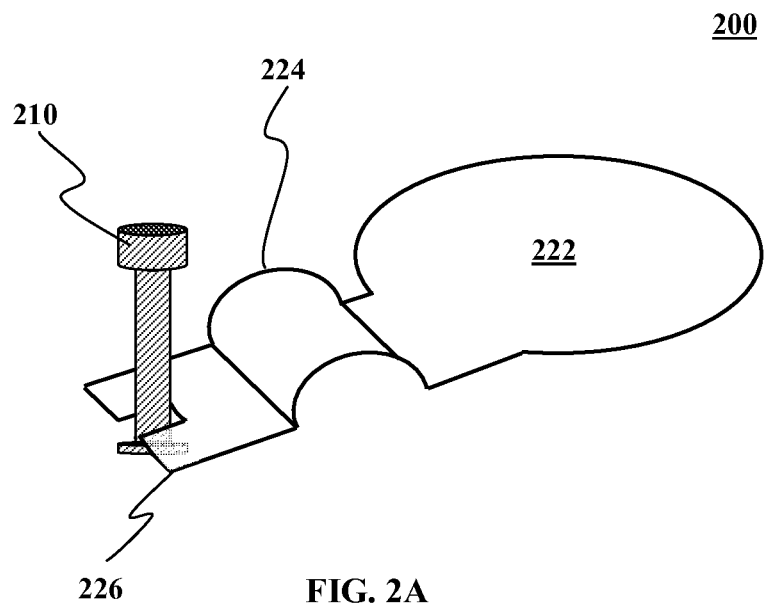
FIG. 2A illustrates an attachment device for mounting a heat shield module on a wafer substrate according to an aspect of the present disclosure.

FIG. 2A is an attachment device 200 for mounting a heat shield module on a wafer substrate in accordance with an aspect of the present disclosure. The attachment device 200 comprises a module leg 210, and a module foot 220 including a head portion 222, a loop portion 224 and a fork portion 226. The module leg 210 is attached to the bottom surface of a heat shield module at one end and inserted to the fork portion 226 of the module foot 220 at the other end. The module leg 210 may include a top portion, a body portion and a bottom portion as the leg 110 shown at FIG. 1B. The module leg 210 may have same structure and configuration as the module leg 110 described above in connection with FIG. 1B.

The module foot 220 includes a head portion 222, a loop portion 224 and a fork portion 226. The head portion 222, the loop portion 224 and the fork portion 226 may be made of a material with a CTE similar to that of substrate. For a silicon substrate, materials such as Kovar®, Invar®, Alloy 42, ceramic, quartz, stainless steel, sapphire, silicon, or any other material that exhibits a suitable CTE value may be used.

The head portion 222 may be a thin piece of metal. By way of example, and not by way of limitation, the shape of the head portion 222 may be in circular, rectangular, or other shapes. The area of the head portion 222 is relatively large and its diameter/width may range, for example, from about 3 mm to about 15 mm. The thickness of the head portion 222 may be about 0.2 mm. The head portion 222 of the module foot 220 is glued to the wafer substrate. The loop portion 224 may be configured to act as a spring to position and secure the heat shield module. By way of example, and not by way of limitation, the loop portion 224 may be in the shape of a semicircle having a radius ranging from about 1 mm to about 3 mm. Other shapes for the loop, e.g., e.g., V-shaped, M-shaped, serpentine, etc., are within the scope of aspects of the present disclosure. Optionally, the module foot 220 of the attachment device 200 may have additional loop portions 224 to accommodate large amount of strain difference between the heat shield module and the wafer substrate. As shown in FIG. 2A, the front end of the fork portion 226 has a slot with a diameter/width large enough to fit the module leg 210. Preferably, it is a deeper slot. The length of the fork portion 226 before forming the loop portion 224 may range from about 3 mm and to about 20 mm. It should be understood that the shape and size of the module leg 210 and the head portion 222 of the module foot 220 can be changed to increase or decrease surface area of contact.

Figure 2B:
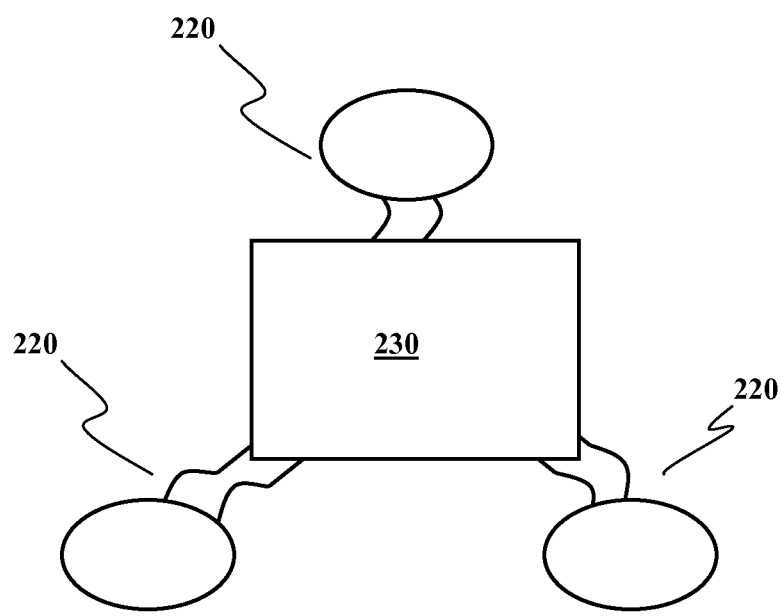
FIG. 2B illustrates a heat shield module with attachment devices according to an aspect of the present disclosure.

One or more attachment devices 200 may be provided for a heat shield module to mount on the substrate of the measuring device. FIG. 2B shows an example with three attachment devices 200. For each attachment device, one end of the module leg 210 is attached to the bottom of the module 230 by press fitting or welding. In one example, the legs 210 are rigidly attached to the module 230 by laser welding. The other end of the leg 210 is held by the fork portion 226. Optionally, the legs 210 may be glued in the slot. No adhesive is applied between the fork portion of the module foot and the wafer. Instead, the head portion 222 of the module foot 220 is attached to the wafer using adhesive, such as epoxy, polymide, or ceramic adhesive, etc. The loop portion 224 acting as a spring under compression may secure the module in position and provide for mechanical compliance in case the module expands with change in temperature. In addition, the loop portion 224 may accommodate any strain difference resulting from a temperature and/or CTE difference between the wafer and the module.

By way of example, and not by way of limitation, a module 230 may be mounted to a substrate using the attachment device 200 in the following manner. First, the legs 210 may be welded to the bottom of the module 230. The legs 210 may then be slid into the slots of the fork portions 226. The head portion 222 of the module foot 220 may then be secured to the substrate (e.g., a silicon wafer) using an adhesive.

It is noted that for applications where the substrate is exposed to high temperature (e.g., greater than about 300° C.), there are very few adhesives that can work in that temperature range. To address this issue the module foot 220 may be mechanically attached to the module 230 via the legs 210, e.g., by mechanically securing the leg to the slot in the fork portion 226. A high temperature adhesive (i.e., one that is reliable at temperatures greater than about 300° C.) may be used to attach the foot 220 to the substrate. The area of the foot has to be large enough to form a good bond using such adhesives.

Figure 3A:
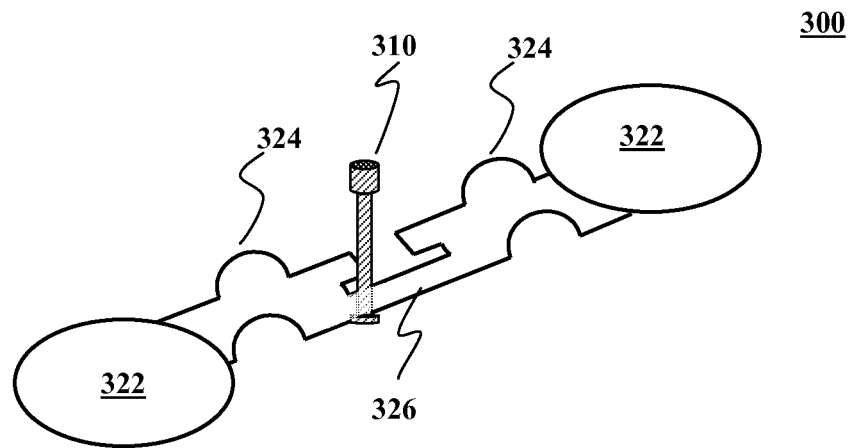
FIG. 3A illustrates an attachment device for mounting a heat shield module on a wafer substrate according to an aspect of the present disclosure.

FIG. 3A shows another attachment device for mounting a heat shield module on a wafer substrate according to an aspect of the present disclosure. The attachment device 300 includes a module leg 310, and a module foot 320 including two end portions 322, two loop portions 324 and a slot 326. The module leg 310 may have same configuration and structure as the leg 110 of FIG. 1B. Each of the end portions 322 may be configured as the head portion 222 as described above in connection with FIG. 2A. It should be understood that the shape and size of the module leg 310 and the end portions 322 of the module foot 320 can be changed to increase or decrease surface area of contact. Similarly, the loop portions 324 may have same structure and configuration as the loop portions 224 as described above in connection with FIG. 2A. Optionally, the module foot 320 of the attachment device 300 may have additional loop portions 324 to accommodate large amount of strain difference between the heat shield module and the wafer substrate. The slot 326 may be a T-shaped or L-shaped slot (not shown). The slot 326 has a diameter/width large enough to fit the module leg 310. One end of the leg 310 may be slid into the slot 326. Optionally, the legs 310 may be glued in the slot. No adhesive is applied between the slot 326 of the module foot and the wafer substrate.

Figure 3B:
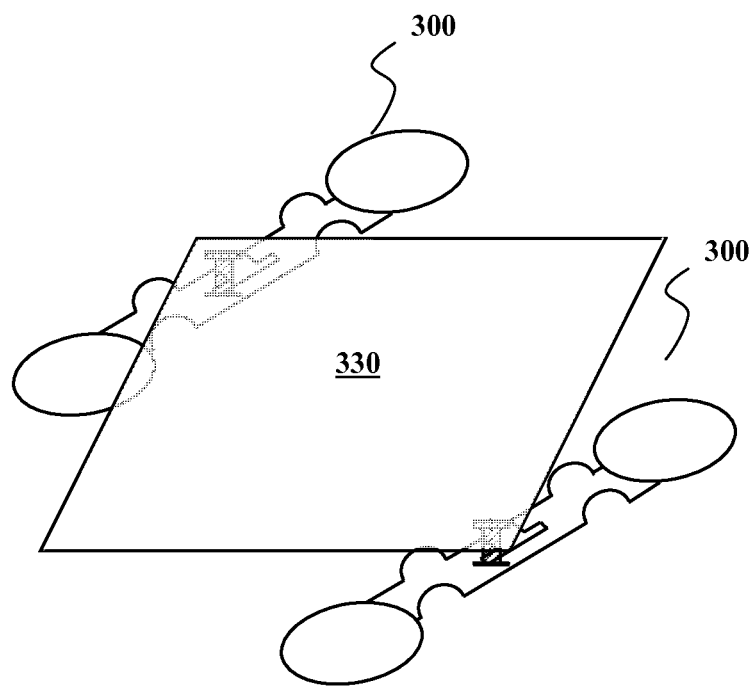
FIG. 3B illustrates a heat shield module with attachment devices according to an aspect of the present disclosure.

FIG. 3B shows a heat shield module 330 provided with two attachment devices 300. For each attachment device 300, one end of the leg 310 is attached to the bottom of the module 330 and the other end of the leg may be mechanically secured to the module foot 320, e.g., by sliding it into the slot 326 of the module foot. The loop portions 324 of the module foot act as springs and may help to position the module. In addition, the loop portions may flex in case the module expands. Also, the loop portions 324 may accommodate strain differences coming from a temperature and CTE difference between the wafer and the module.

Figure 4A:
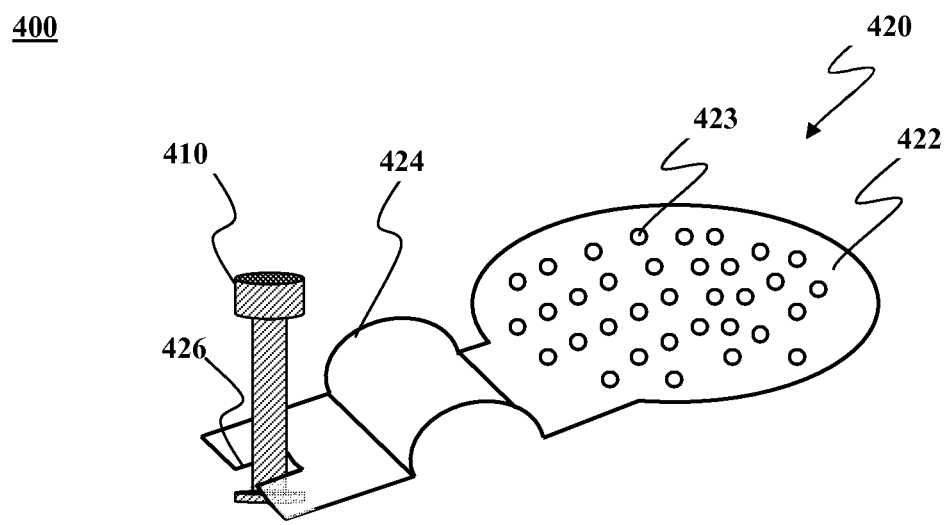
FIG. 4A illustrates an attachment device for mounting a heat shield module on a wafer substrate according to an aspect of the present disclosure.
Figure 4B:
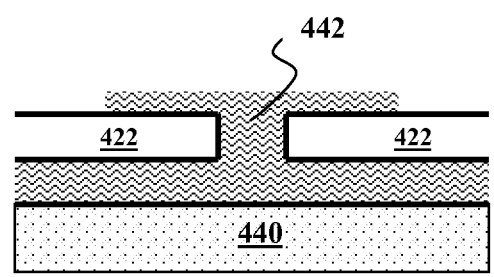
FIG. 4B is a cross-sectional view of a portion of the attachment device of FIG. 4A.
Figure 5:
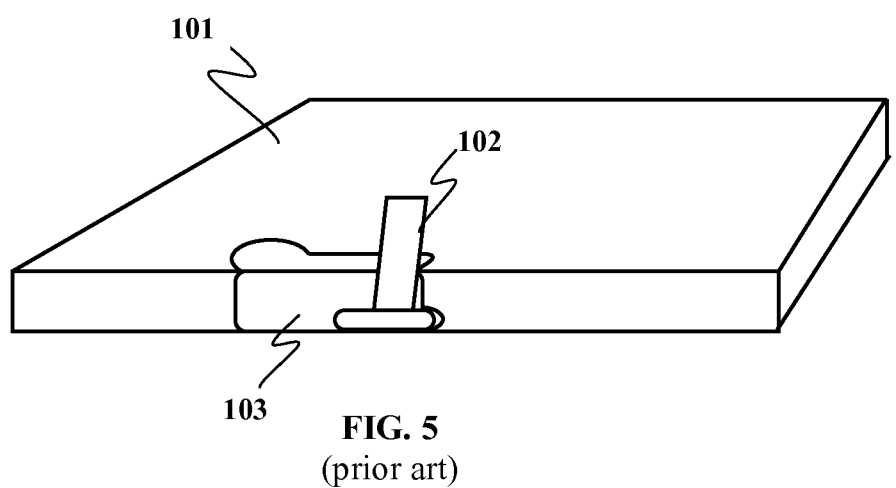
FIG. 5 is a partial cutaway diagram illustrating a portion of a prior art mounting system.

A further embodiment of the present disclosure may have the module foot of FIG. 1A, the head portion of the module foot of FIG. 2A or the end portion of the module foot of FIG. 3A perforated to increase adhesion. For example, as shown in FIG. 4A, an attachment device 400 may include a module foot 420 having a head portion 422, a loop portion 424 and an end with a slot 426 that receives a leg 410. A number of through holes 423 are formed in the head portion 422. When the head portion 422 is glued to the wafer 440 with an adhesive 442, the excess adhesive may flow through the holes to the top surface of the head portion 422 forming rivets as shown in FIG. 4B. As a result, a mechanical interlock may be formed between the cured adhesive and the perforations. Perforations on the head portions also allow outgassing to escape through the holes during curing.

Aspects of the present disclosure provide for wireless temperature sensing wafers having a low profile insulating heat shield module that can be attached to the wafer and that can work at temperatures higher than 150° C. Aspects of the present disclosure allow the module to be mounted separate from the wafer using an attachment device that avoids having to grind the wafer.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112, ¶ 6. In particular, the use of "step of" in the claims herein is not intended to invoke the provisions of 35 USC §112, ¶ 6.

What is claimed is:

1. An apparatus, comprising:
   a leg with two ends; and
   a foot, wherein the foot is made of a material with a coefficient of thermal expansion similar to that of the substrate, wherein at least a portion of the foot is configured to be attached to a substrate,
   wherein one end of the leg is configured to be attached to a surface of a module and another end of the leg is configured to be attached to the foot, wherein a portion of a surface area of the foot is configured to be disposed outside an area covered by the module when the module is mounted to the substrate, wherein the foot has a first portion configured to be attached to the substrate, a second portion having a loop configured to act as a spring configured to position and secure the module and a third portion configured to hold the leg, wherein the second portion is between the first portion and the third portion.

2. The apparatus claim 1, wherein the leg has a first end portion, a body portion and a second end portion, wherein the body portion has a diameter or a width relatively narrower than the diameter or a width of the first end portion and the second end portion.

3. The apparatus of claim 1, wherein the leg is made of a material characterized by low thermal conductivity.

4. The apparatus of claim 3, wherein the leg is made of stainless steel, quartz, a nickel-cobalt ferrous alloy, a nickel steel alloy or a nickel iron alloy, or a machinable glass-ceramic.

5. The apparatus of claim 3, wherein the foot is made of silicon, stainless steel, sapphire, a nickel-cobalt ferrous alloy, a nickel steel alloy or a nickel iron alloy.

6. The apparatus of claim 1, wherein the leg is attached to the surface of the module by press fitting or welding.

7. The apparatus of claim 1, wherein the leg is attached to the foot by press fitting or welding.

8. The apparatus of claim 1, wherein the foot is configured to be attached to the substrate with a high temperature adhesive.

9. The apparatus of claim 1, wherein the first portion of the foot is exposed outside of an area covered by the module.

10. The apparatus of claim 1, wherein the third portion of the foot has a slot with a diameter or a width large enough to fit the leg.

11. The apparatus of claim 10, wherein the leg is mechanically secured to the slot.

12. The apparatus of claim 1, wherein the foot has one or more perforations on the portion of the foot that is configured to be attached to the substrate.

13. The apparatus of claim 1, wherein the leg provides an electrical grounding path for the module.

14. A device, comprising:
a substrate;
one or more modules, each of the modules including a temperature sensitive electronic component, one or more insulating layers, and an enclosure, where the one or more insulating layers encapsulate the temperature sensitive electronic component and wherein the temperature sensitive electronic component and the one or more insulating layers are contained in the enclosure; and
one or more attachment devices for mounting the modules on the substrate, each attachment devices comprising a leg with two ends and a foot, wherein at least a portion of the foot is attached to the substrate,
wherein one end of the leg is attached to a surface of the module and the other end of the leg is attached to the foot and wherein a large surface area of the foot is disposed outside of an area covered by the module.

15. The device of claim 14, wherein the leg has a first end portion, a body portion and a second end portion, wherein the body portion has a diameter or a width relatively narrower than the diameter or a width of the first end portion and the second end portion.

16. The device of claim 14, wherein the leg is made of stainless steel, quartz, a nickel-cobalt ferrous alloy, a nickel steel alloy or a nickel iron alloy.

17. The device of claim 14, wherein the foot is made of silicon, stainless steel, quartz, a nickel-cobalt ferrous alloy, a nickel steel alloy or a nickel iron alloy.

18. The device of claim 14, wherein the leg is attached to the bottom surface of the module by press fitting or welding.

19. The device of claim 14, wherein the leg is attached to the module foot by press fitting or welding.

20. The device of claim 14, wherein the foot is attached to the substrate with a high temperature adhesive.

21. The device of claim 14, wherein the foot has a first portion to be attached to the substrate, a second portion to help position the module and a third portion to hold the leg.

22. The device of claim 21, wherein the first portion of the foot is exposed outside of an area covered by the module.

23. The device of claim 21, wherein the third portion of the foot has a slot with a diameter or a width large enough to fit the module leg.

24. The device of claim 23, wherein the leg is mechanically secured to the slot.

25. The device of claim 14, wherein the foot has a number of perforations on a portion of the foot that is attached to the substrate.

26. The device of claim 14, wherein the leg provides an electrical grounding path for the module.

* * * * *